US012614703B2

(12) United States Patent
Ezaki et al.

(10) Patent No.: US 12,614,703 B2
(45) Date of Patent: Apr. 28, 2026

(54) PLASMA PROCESSING METHOD AND PLASMA PROCESSING APPARATUS

(71) Applicant: Tokyo Electron Limited, Tokyo (JP)

(72) Inventors: Shota Ezaki, Miyagi (JP); Masanori Takahashi, Miyagi (JP); Kazuhito Yamada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 979 days.

(21) Appl. No.: 17/848,760

(22) Filed: Jun. 24, 2022

(65) Prior Publication Data

US 2022/0415628 A1     Dec. 29, 2022

(30) Foreign Application Priority Data

Jun. 25, 2021     (JP) ................................. 2021-106027

(51) Int. Cl.
     H01J 37/32          (2006.01)

(52) U.S. Cl.
     CPC .. H01J 37/32724 (2013.01); H01J 37/32082 (2013.01); H01J 37/32642 (2013.01)

(58) Field of Classification Search
     CPC ........... H01J 37/32724; H01J 37/32541; H01J 37/32568; H01J 37/32532; H01J 37/32091; H05B 1/0233; H05B 6/54; H05B 6/62; H05B 2203/037; H05B 3/283; H01L 21/67017; H01L 21/67069; H01L 21/6831
     See application file for complete search history.

(56) References Cited

U.S. PATENT DOCUMENTS

| | | | |
|---|---|---|---|
| 10,892,144 B2 | 1/2021 | Oka | |
| 11,546,970 B2 | 1/2023 | Oka | |
| 11,557,468 B2 | 1/2023 | Oka | |
| 2002/0068371 A1 | 6/2002 | Yun | |
| 2019/0148120 A1 | 5/2019 | Oka | |
| 2020/0111650 A1* | 4/2020 | Oka | .................. H01J 37/32522 |
| 2022/0084850 A1 | 3/2022 | Oka | |
| 2022/0415628 A1 | 12/2022 | Ezaki | |
| 2023/0087979 A1 | 3/2023 | Oka | |
| 2023/0105165 A1 | 4/2023 | Oka | |

FOREIGN PATENT DOCUMENTS

JP          2016-001688 A     1/2016

* cited by examiner

*Primary Examiner* — Robert G Bachner
(74) *Attorney, Agent, or Firm* — Nath, Goldberg & Meyer; Jerald L. Meyer

(57)          ABSTRACT

A plasma processing method includes: setting a temperature of a substrate support surface to a first temperature; supplying electric power from an electric power adjuster to a heater; before plasma is generated, when the temperature of the substrate support surface measured by a temperature sensor stabilizes at the first temperature, measuring first electric power supplied to the heater; after the plasma is generated, when the temperature of the substrate support surface measured by the temperature sensor stabilizes at the first temperature, measuring second electric power supplied to the heater; calculating an input heat quantity input from the plasma based on the first electric power and the second electric power; and correcting the first temperature to a second temperature based on the input heat quantity and a thermal resistance between the substrate support and the temperature sensor or between a substrate and the temperature sensor.

20 Claims, 5 Drawing Sheets

PLASMA PROCESSING METHOD AND PLASMA PROCESSING APPARATUS

CROSS-REFERENCE TO RELATED APPLICATION

This application is based upon and claims the benefit of priority from Japanese Patent Application No. 2021-106027, filed on Jun. 25, 2021, the entire contents of which are incorporated herein by reference.

TECHNICAL FIELD

The present disclosure relates to a plasma processing method and a plasma processing apparatus.

BACKGROUND

Patent Document 1 discloses a stage including a support and a base. The support includes a mounting region having a heater and an outer peripheral region surrounding the mounting region. Patent Document 1 discloses that a plurality of heaters is also arranged in the mounting region and individually adjusted electric power is supplied to each heater, so that temperatures of a plurality of partial regions of the mounting region are individually adjusted.

PRIOR ART DOCUMENT

Patent Document

Patent Document 1: Japanese Laid-Open Patent Publication No. 2016-001688

SUMMARY

According to one embodiment of the present disclosure, there is provided a plasma processing method performed by a plasma processing apparatus, wherein the plasma processing apparatus includes: a base; a substrate support disposed on the base and having a substrate support surface for supporting a substrate; a first heater disposed inside the substrate support and configured to adjust a temperature of the substrate support surface; a first temperature sensor configured to measure the temperature of the substrate support surface; and a first electric power adjuster configured to adjust electric power supplied to the first heater, and wherein the plasma processing method includes: setting the temperature of the substrate support surface to a first temperature; supplying electric power from the first electric power adjuster to the first heater; before plasma is generated, when the temperature of the substrate support surface measured by the first temperature sensor stabilizes at the first temperature, measuring first electric power supplied to the first heater by the first electric power adjuster; after the plasma is generated, when the temperature of the substrate support surface measured by the first temperature sensor stabilizes at the first temperature, measuring second electric power supplied to the first heater by the first electric power adjuster; calculating a first input heat quantity input from the plasma based on the first electric power and the second electric power; and correcting the first temperature to a second temperature based on the first input heat quantity and a thermal resistance between the substrate support and the first temperature sensor or between the substrate and the first temperature sensor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
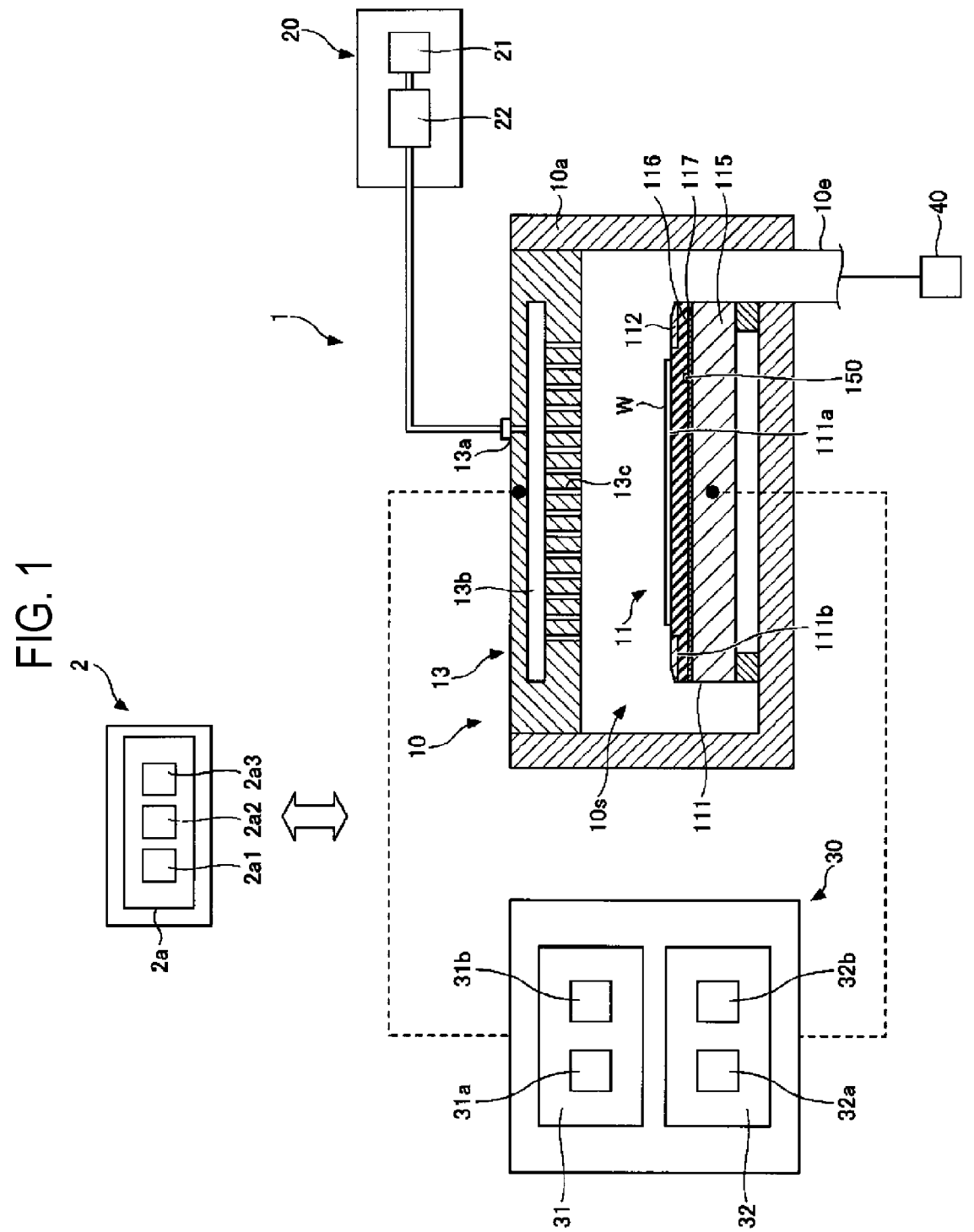
FIG. 1 is a view illustrating a configuration example of a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for carrying out the present disclosure will be described with reference to the drawings. In the subject specification and the drawings, substantially the same configurations are designated by like reference numerals, and duplicate explanations thereof are omitted. In addition, for ease of understanding, the scale of each part in the drawings may differ from the actual scale.

In the directions such as parallel, perpendicular, orthogonal, horizontal, vertical, up/down, left/right, and the like, a deviation that does not impair the effects of the embodiment is allowed. The shape of a corner portion is not limited to a right angle, and may be rounded in a bow shape. Parallel, perpendicular, orthogonal, horizontal, and vertical may include substantially parallel, substantially perpendicular, substantially orthogonal, substantially horizontal, and substantially vertical, respectively.

Hereinafter, a configuration example of a plasma processing apparatus will be described with reference to FIG. 1.

A capacitively coupled plasma processing apparatus 1 includes a plasma processing chamber 10, a gas supply 20, a power supply 30, and an exhaust system 40. Further, the plasma processing apparatus 1 includes a substrate support body 11 and a gas introducer. The gas introducer is configured to introduce at least one processing gas into the plasma processing chamber 10. The gas introducer includes a shower head 13. The substrate support body 11 is disposed in the plasma processing chamber 10. The shower head 13 is disposed above the substrate support body 11. In one embodiment, the shower head 13 constitutes at least a portion of a ceiling of the plasma processing chamber 10. The plasma processing chamber 10 has a plasma processing space 10s defined by the shower head 13, a side wall 10a of the plasma processing chamber 10, and the substrate support body 11. The plasma processing chamber 10 has at least one gas supply port for supplying at least one processing gas to the plasma processing space 10s, and at least one gas discharge port for discharging a gas from the plasma processing space 10s. The side wall 10a is grounded. The shower head 13 and the substrate support body 11 are electrically insulated from a housing of the plasma processing chamber 10.

The substrate support body 11 includes a main body 111 and a ring assembly 112. The main body 111 has a central region (substrate support surface) 111a for supporting a substrate (wafer) W and an annular region (ring support surface) 111b for supporting the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 so as to surround the substrate W on the central region 111a of the main body 111. In one embodiment, the main body 111 includes a base 115 and a substrate support 116. The substrate support 116 is, for example, an electrostatic chuck including a main body made of a dielectric material and electrodes disposed in the main body. Further, the substrate support 116 may be a ring support that holds the ring assembly 112. The substrate support 116 is fixed to the base 115 via an adhesive layer 117. The base 115 includes a conductor. The conductor of the base 115 functions as a lower electrode. The substrate support 116 is disposed on the base 115. An upper surface of the substrate support 116 has the substrate support surface 111a. The substrate support 116 includes a heater 118 (see FIG. 2), which is disposed in the substrate support 116 and capable of adjusting a temperature of the substrate support surface 111a. The ring assembly 112 includes one or more annular members. At least one of the one or more annular members is an edge ring. Further, although not shown, the substrate support body 11 may include a temperature adjustment module configured to adjust a temperature of at least one selected from the group of the substrate support 116, the ring assembly 112, and the substrate W to a target temperature. The temperature adjustment module may include a heater, a heat transfer medium, a flow path, or a combination thereof. A heat transfer fluid such as brine and gas flows through the flow path. Further, the substrate support body 11 may include a heat transfer gas supply configured to supply a heat transfer gas to a space between a back surface of the substrate W and the substrate support surface 111a. The substrate support body 11 includes a temperature sensor 150, which is disposed closer to the base 115 of the substrate support 116 than the heater 118 and measures the temperature of the substrate support surface 111a. In the substrate support 116, the substrate support surface 111a and the ring support surface 111b are integrated. However, a substrate support having the substrate support surface 111a and a ring support having the ring support surface 111b may be provided separately.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b. The processing gas is introduced into the plasma processing space 10s from the plurality of gas introduction ports 13c. Further, the shower head 13 includes a conductor. The conductor of the shower head 13 functions as an upper electrode. The gas introducer may include, in addition to the shower head 13, one or more side gas injectors (SGIs) attached to one or more openings formed in the side wall 10a.

The gas supply 20 may include at least one gas source 21 and at least one flow rate controller 22. In one embodiment, the gas supply 20 is configured to supply at least one processing gas from a corresponding gas source 21 to the shower head 13 via a corresponding flow rate controller 22. Each flow rate controller 22 may include, for example, a mass flow controller or a pressure-controlled flow rate controller. Further, the gas supply 20 may include one or more flow rate modulation devices that modulate or pulse a flow rate of at least one processing gas.

The power supply 30 includes an RF power supply 31 coupled to the plasma processing chamber 10 via at least one impedance matching circuit. The RF power supply 31 is configured to supply at least one RF signal (RF power), such as a source RF signal or a bias RF signal, to the conductor of the substrate support body 11 and/or the conductor of the shower head 13. As a result, plasma is formed from at least one processing gas supplied to the plasma processing space 10s. Thus, the RF power supply 31 may function as at least a part of a plasma generator configured to generate plasma from one or more processing gases in the plasma processing chamber 10. Further, by supplying the bias RF signal to the conductor of the substrate support body 11, a bias potential is generated in the substrate W, and ion component in the formed plasma can be drawn into the substrate W.

In one embodiment, the RF power supply 31 includes a first RF generator 31a and a second RF generator 31b. The first RF generator 31a is coupled to the conductor of the substrate support body 11 and/or the conductor of the shower head 13 via at least one impedance matching circuit, and is configured to generate a source RF signal (source RF power) for plasma generation. In one embodiment, the source RF signal has a frequency within a range of 13 MHz to 150 MHz. In one embodiment, the first RF generator 31a may be configured to generate a plurality of source RF signals having different frequencies. The generated one or more source RF signals are supplied to the conductor of the substrate support body 11 and/or the conductor of the shower head 13. The second RF generator 31b is coupled to the conductor of the substrate support body 11 via at least one impedance matching circuit, and is configured to generate a bias RF signal (bias RF power). In one embodiment, the bias RF signal has a lower frequency than that of the source RF signal. In one embodiment, the bias RF signal has a frequency within a range of 400 kHz to 13.56 MHz. In one embodiment, the second RF generator 31b may be configured to generate a plurality of bias RF signals having different frequencies. The generated one or more bias RF signals are supplied to the conductor of the substrate support body 11. In various embodiments, at least one of the source RF signal and the bias RF signal may be pulsed.

In addition, the power supply 30 may include a DC power supply 32 coupled to the plasma processing chamber 10. The DC power supply 32 includes a first DC generator 32a and a second DC generator 32b. In one embodiment, the first DC generator 32a is connected to the conductor of the substrate support body 11 and is configured to generate a first DC signal. The generated first DC signal is applied to the conductor of the substrate support body 11. In one embodiment, the first DC signal may be applied to another electrode, such as the electrode in the substrate support 116. In one embodiment, the second DC generator 32b is connected to the conductor of the shower head 13 and is configured to generate a second DC signal. The generated second DC signal is applied to the conductor of the shower head 13. In various embodiments, at least one of the first and second DC signals may be pulsed. In addition, the first and second DC generators 32a and 32b may be provided in addition to the RF power supply 31, and the first DC generator 32a may be provided in place of the second RF generator 31b.

The exhaust system 40 may be connected to, for example, a gas discharge port 10e provided at a bottom of the plasma processing chamber 10. The exhaust system 40 may include a pressure regulation valve and a vacuum pump. The pressure regulation valve is configured to regulate a pressure in the plasma processing space 10s. The vacuum pump may include a turbo molecular pump, a dry pump, or a combination thereof.

The plasma processing apparatus 1 includes a controller 2. The controller 2 processes computer-executable instructions that cause the plasma processing apparatus 1 to perform various steps described in the present disclosure. The controller 2 may be configured to control respective components of the plasma processing apparatus 1 to perform the various steps described herein. The controller 2 may include, for example, a computer 2a. The computer 2a may include, for example, a processor (CPU: Central Processing Unit) 2a1, a memory 2a2, and a communication interface 2a3. The processor 2a1 may be configured to perform various control operations based on a program stored in the memory 2a2. The memory 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN) or the like.

<Plasma Processing Method According to the Present Embodiment>

Figure 2:
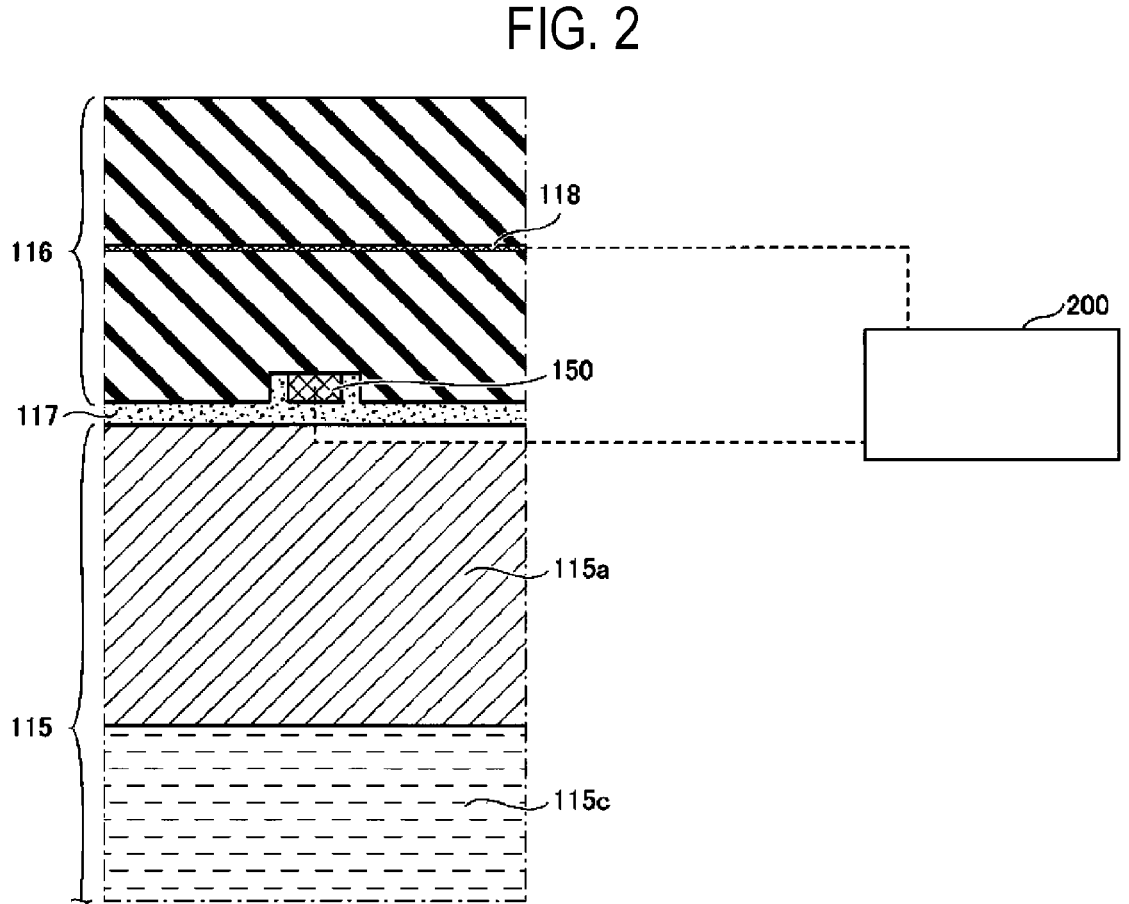
FIG. 2 is a view illustrating a process performed by the plasma processing apparatus according to the embodiment.

A plasma processing method according to the present embodiment will be described. FIG. 2 is a view illustrating a process performed by the plasma processing apparatus 1 according to the present embodiment. Specifically, FIG. 2 shows a partial cross section of the substrate support body 11 of the plasma processing apparatus 1.

The substrate support body 11 includes the base 115 and the substrate support 116. The substrate support 116 is attached to the base 115 via the adhesive layer 117.

The base 115 includes a base main body 115a formed of metal and a flow path 115c provided inside the base main body 115a. A coolant such as brine or the like having a temperature adjusted to a set temperature flows through the flow path 115c.

By exchanging heat with the coolant flowing through the flow path 115c, a temperature of the base 115 is adjusted to the set temperature. Then, the substrate support 116 attached to the base 115 is cooled by the base 115.

The substrate support 116 includes the heater 118 installed therein. The heater 118 heats the substrate W mounted on the substrate support surface 111a.

The substrate support body 11 includes the temperature sensor 150. The temperature sensor 150 may be disposed closer to the base 115 than the heater 118. The temperature sensor 150 measures the temperature of the substrate support surface 111a.

The heater 118 and the temperature sensor 150 are connected to an electric power adjuster 200. The electric power adjuster 200 adjusts electric power supplied to the heater 118 so that the temperature detected by the temperature sensor 150 becomes a set temperature Tset set by the controller 2. The electric power adjuster 200 controls the electric power supplied to the heater 118 by, for example, proportional-integral-differential (PID) control, so that the temperature detected by the temperature sensor 150 becomes the set temperature Tset.

Here, flows of heat in the plasma processing apparatus 1 in a case where plasma is not generated and in a case where plasma is generated will be described.

Figure 3:
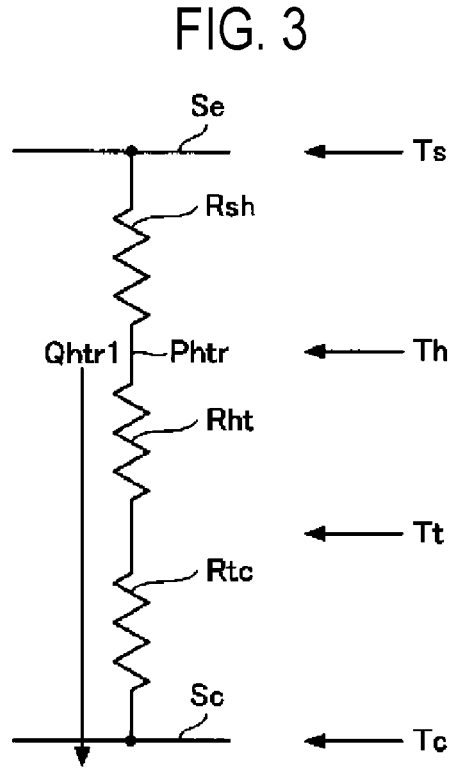
FIG. 3 is a view illustrating a heat flow in a state in which plasma is not generated in the plasma processing apparatus according to the embodiment.
Figure 4:
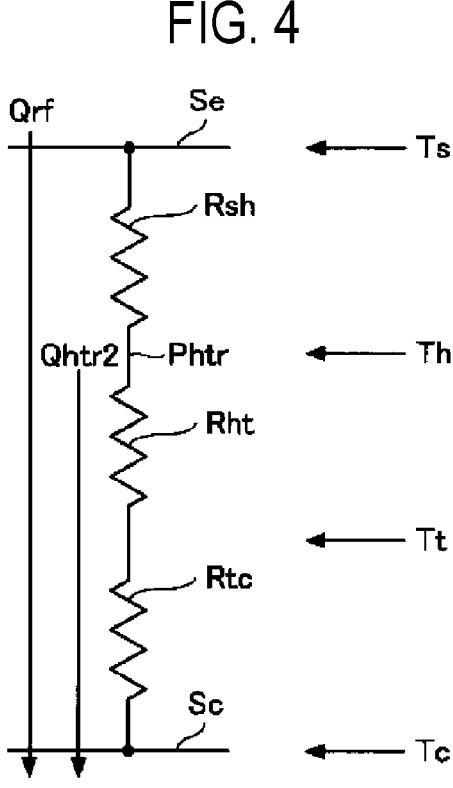
FIG. 4 is a view illustrating a heat flow in a state where plasma is generated in the plasma processing apparatus according to the embodiment.

FIG. 3 is a view illustrating a heat flow in a state in which plasma is not generated in the plasma processing apparatus 1 according to the present embodiment. FIG. 4 is a view illustrating a heat flow in a state in which plasma is generated in the plasma processing apparatus 1 according to the present embodiment.

FIGS. 3 and 4 are views modeling heat flows from a surface Se (the substrate support surface 111a) of the substrate support 116 to a surface Sc of the flow path 115c.

Between the surface Se of the substrate support 116 and the surface Sc of the flow path 115c, it is assumed that a thermal resistance Rsh exists between the surface Se and the heater 118, a thermal resistance Rht exists between the heater 118 and the temperature sensor 150, and a thermal resistance Rtc exists between the temperature sensor 150 and the flow path 115c. Further, a temperature of the surface Se is defined as a temperature Ts, a temperature of the heater 118 is defined as a temperature Th, a temperature of the temperature sensor 150 is defined as a temperature Tt, and a temperature of the flow path 115c, that is, a temperature of the coolant flowing through the flow path 115c, is defined as a temperature Tc.

In addition, it is assumed that the thermal resistance Rsh, the thermal resistance Rht, and the thermal resistance Rtc are already known by design values and measured values.

Since the coolant in the flow path 115c is considered to have a sufficiently large heat capacity, it can be considered that the temperature Tc is constant even when the coolant absorbs heat flowing-in from the heater 118.

In the state of FIG. 3 in which plasma is not generated, when a thermal equilibrium state is reached, the temperature Ts of the surface Se and the temperature Th of the heater 118 become equal to each other. At this time, the electric power adjuster 200 adjusts the electric power supplied to the heater 118 so that the temperature Tt of the temperature sensor 150 reaches a set temperature.

A heat quantity Qhtr1 supplied from the heater 118 passes through the thermal resistance Rht and the thermal resistance Rtc, and flows out from the surface Sc to the coolant.

On the other hand, in the state of FIG. 4 in which plasma is generated, a heat quantity Qrf flows in from the surface Se. The heat quantity Qrf passes through the thermal resistance Rsh, the thermal resistance Rht, and the thermal resistance Rtc in the named order, and flows out from the surface Sc. Further, the electric power adjuster 200 adjusts the electric power supplied to the heater 118 so that the temperature Tt of the temperature sensor 150 reaches a set temperature.

When the set temperatures of the temperature sensor 150 in the state in which the plasma is not generated and in the state in which the plasma is generated are set to the same temperature Tt, a heat quantity Qhtr2 becomes smaller than the heat quantity Qhtr1 by the amount of the heat quantity Qrf flowing-in from the plasma. That is, the heat quantity Qhtr2 is represented by Equation 1.

$$Qhtr2 = Qhtr1 - Qrf \qquad \text{Equation 1}$$

In the state in which plasma is generated, a temperature difference ΔT (Kelvin) represented by Equation 2 is generated between the temperature Ts of the surface Se and the temperature Tt of the temperature sensor 150.

$$\Delta T = Rht(Qhtr2 + Qrf) + Rsh \cdot Qrf \qquad \text{Equation 2}$$

In Equation 2, for example, the heat quantity Qrf is defined as Qrf (watt), the heat quantity Qhtr2 is defined as Qhtr2 (watt), the thermal resistance Rht is defined as Rht (Kelvin/watt), and the thermal resistance Rsh is defined as Rsh (Kelvin/watt).

In the state in which plasma is not generated, a temperature difference $\Delta$TO (Kelvin) represented by Equation 3 is generated between the temperature Ts of the surface Se and the temperature Tt of the temperature sensor 150. However, since the thermal resistance Rht and the heat quantity Qhtr1 are already known, it is possible to correct the temperature difference $\Delta$TO.

$$\Delta TO = Rht \cdot Qhtr1 \qquad \text{Equation 3}$$

In Equation 3, for example, the heat quantity Qhtr1 is defined as Qhtr1 (watt), and the thermal resistance Rht is defined as Rht (Kelvin/watt).

In the plasma processing method according to the present embodiment, the electric power supplied to the heater 118 is corrected so that the temperature of the surface Se becomes a desired temperature in the state in which plasma is generated.

Figure 5:
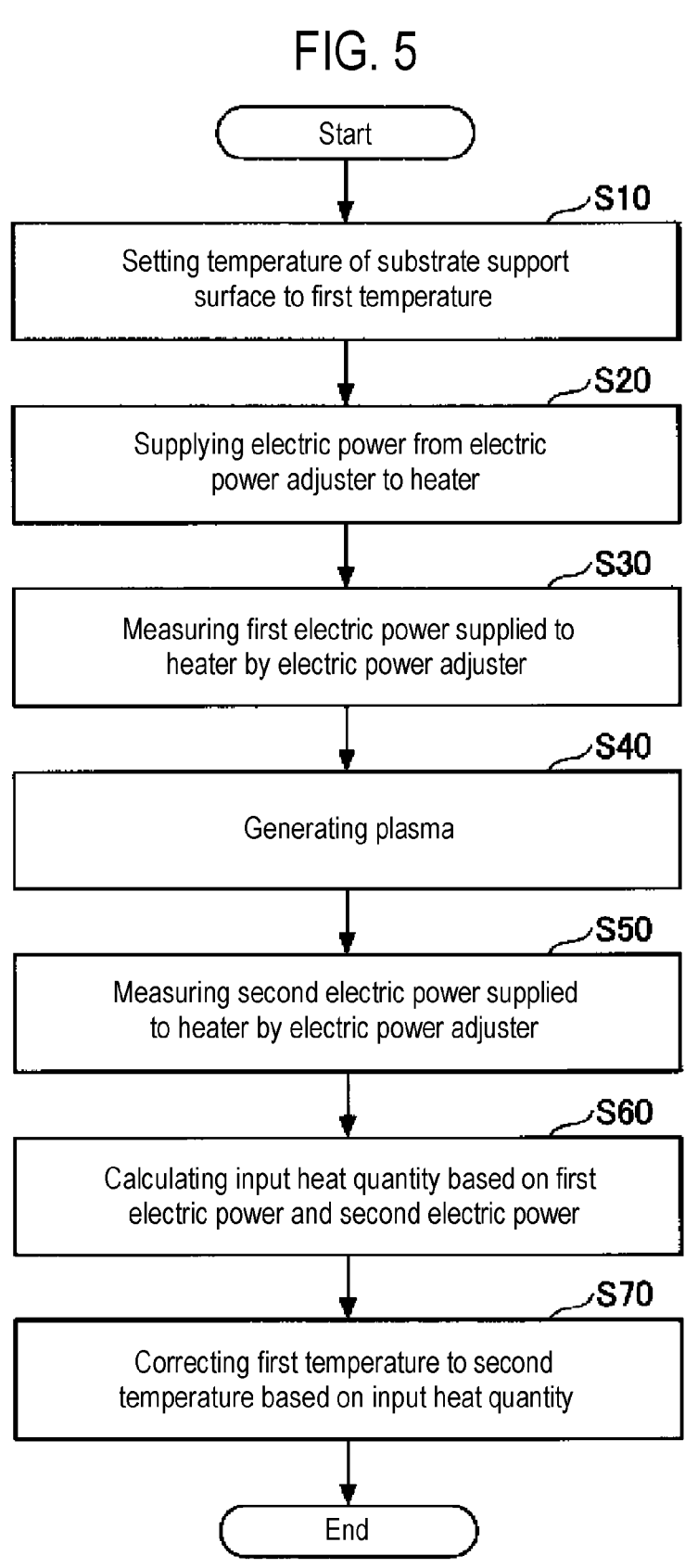
FIG. 5 is a flowchart illustrating a plasma processing method performed by the plasma processing apparatus according to the embodiment.

FIG. 5 is a flowchart illustrating a plasma processing method performed by the plasma processing apparatus 1 according to the present embodiment. It is assumed that plasma is not generated at a stage of starting a process.

First, the controller 2 sets the set temperature Tset of the electric power adjuster 200, i.e., the set temperature Tset of the substrate support surface 111a, to a first temperature T1 (step S10). Subsequently, the controller 2 controls the electric power adjuster 200 to supply electric power from the electric power adjuster 200 to the heater 118 (step S20). After supplying the electric power from the electric power adjuster 200 to the heater 118, the controller 2 waits until the temperature measured by the temperature sensor 150 stabilizes at the first temperature T1 which is the set temperature Tset.

The determination that the temperature measured by the temperature sensor 150 has reached the first temperature T1 is not limited to a case where the temperature measured by the temperature sensor 150 completely matches the first temperature T1, but may also include, for example, a case where the temperature measured by the temperature sensor 150 falls within a control range including the first temperature T1.

When the temperature measured by the temperature sensor 150 stabilizes at the first temperature T1, the controller 2 controls the electric power adjuster 200 to measure first electric power P1 supplied by the electric power adjuster 200 to the heater 118 (step S30). Steps S10, S20, and S30 are executed in the state in which plasma is not generated, i.e., before plasma is generated.

Subsequently, the controller 2 supplies a processing gas from the gas supply 20, and supplies RF power from the power supply 30, i.e., controls the plasma generator to generate plasma (step S40). Then, the controller 2 waits until the temperature measured by the temperature sensor 150 stabilizes at the first temperature T1 after the plasma generation is started. When the temperature measured by the temperature sensor 150 stabilizes at the first temperature T1, the controller 2 controls the electric power adjuster 200 to measure second electric power P2 supplied by the electric power adjuster 200 to the heater 118 (step S50). Step S50 is executed in the state in which plasma is generated, i.e., after plasma is generated.

Subsequently, the controller 2 calculates an input heat quantity Qin input from the plasma per unit time in the state in which the plasma is generated, based on the first electric power P1 and the second electric power P2 (step S60). Assuming that a heat quantity generated by the heater 118 per unit time when the first electric power P1 is supplied to the heater 118 is Q1, and a heat quantity generated by the heater 118 per unit time when the second electric power P2 is supplied to the heater 118 is Q2, the input heat quantity Qin is represented by Equation 4.

$$Qin = Q1 - Q2 \qquad \text{Equation 4}$$

A method of calculating electric power of the heater 118 will be described. For example, it is assumed that the electric power adjuster 200 controls the electric power of the heater 118 by pulse width modulation (PWM) control. First, a case where the electric power adjuster 200 supplies a DC voltage to the heater 118 will be described. Assuming that a heater resistance of the heater 118 is Rhtr (ohm), the DC voltage when supplying electric power from the electric power adjuster 200 is Vsup (volt), a duty ratio when performing PWM control is p (%), and a heat quantity output from the heater 118 per unit time is Phtr (watt), the electric power output from the heater 118 is represented by Equation 5.

$$Phtr = \frac{Vsup^2}{Rhtr} \cdot \frac{P}{100} \qquad \text{Equation 5}$$

By using the electric power calculated by Equation 5, the heat quantity generated from the heater 118 per unit time is calculated.

Next, a case where the electric power adjuster 200 supplies an AC voltage to the heater 118 will be described. Assuming that the heater resistance of the heater 118 is Rhtr (ohm), an amplitude of the AC voltage when supplying electric power from the electric power adjuster 200 is Vsup2 (volt), the duty ratio when performing PWM control is p (%), and the heat quantity output from the heater 118 per unit time is Phtr (watt), the electric power output from the heater 118 is represented by Equation 6, where cos $\theta$ denotes a power factor.

$$Phtr = \frac{Vsup2^2}{Rhtr} \cdot \frac{P}{100} \cdot \frac{\cos\theta}{2} \qquad \text{Equation 6}$$

By using the electric power calculated by Equation 6, the heat quantity generated from the heater 118 per unit time is calculated.

In addition, assuming that a set temperature Tset before correction is Tset1 (degrees C.) and a set temperature Tset after correction is Tset2 (degrees C.), the set temperature Tset2 is represented by Equation 7.

$$Tset2 = \frac{Tset1 - Tc - Qin \cdot Rsh}{1 + \dfrac{Q1 \cdot Rht}{Tset1 - Tc}} + Tc \qquad \text{Equation 7}$$

In Equation 7, for example, the heat quantity Q1 is Q1 (watt), the input heat quantity Qin is Qin (watt), the thermal resistance Rht is Rht (Kelvin/watt), and the thermal resistance Rsh is Rsh (Kelvin/watt).

The thermal resistance Rsh between the surface Se of the substrate support 116 and the heater 118 and the thermal resistance Rht between the heater 118 and the temperature sensor 150 are examples of the thermal resistance between the substrate support 116 and the temperature sensor 150.

In addition, when it is desired to control the temperature of the wafer mounted on the substrate support surface 111*a*, assuming that a thermal resistance of the wafer is Rw (Kelvin/watt), a contact thermal resistance between the wafer and the substrate support surface 111*a* is Rcon (Kelvin/watt), and a set temperature Tset after correction is Tsetw (degrees C.), the set temperature Tsetw is represented by Equation 8.

$$Tsetw = \frac{Tset1 - Tc - Qin(Rw + Rcon + Rsh)}{1 + \dfrac{Q1 \cdot Rht}{Tset1 - Tc}} + Tc \qquad \text{Equation 8}$$

In Equation 8, for example, the heat quantity Q1 is Q1 (watt), the input heat quantity Qin is Qin (watt), the thermal resistance Rht is Rht (Kelvin/watt), and the thermal resistance Rsh is Rsh (Kelvin/watt).

The thermal resistance Rsh between the surface Se of the substrate support 116 and the heater 118, the thermal resistance Rw of the wafer, the thermal resistance Rcon between the wafer and the substrate support surface 111*a*, and the thermal resistance Rht between the heater 118 and the temperature sensor 150 are examples of the thermal resistance between the substrate W and the temperature sensor 150.

In the above description, the substrate support surface 111*a* has been described. However, by performing the same process on the annular region (ring support surface) 111*b* that supports the annular member of the ring assembly 112, it is possible to adjust a temperature of the annular member of the ring assembly 112 to a desired temperature.

For example, the annular region 111*b* of the main body 111 may include a heater (second heater), an electric power adjuster (second electric power adjuster) for supplying electric power to the heater (second heater), and a temperature sensor (second temperature sensor) for measuring a temperature of the ring support surface 111*b*.

In addition, in the above description, the number of heaters 118 and temperature sensors 150 included in the substrate support 116 is not mentioned. However, the number of heaters 118 and temperature sensors 150 may be plural. That is, the substrate support 116 may have a plurality of regions, and may be configured to include a heater 118 and a temperature sensor 150 disposed for each of the plurality of regions. Similarly, when the annular region 111*b* of the main body 111 includes a second heater, the annular region 111*b* may have a plurality of regions and may be configured to dispose a second temperature sensor for each of the plurality of regions.

<Operative Effect>

According to the plasma processing apparatus 1 of the present disclosure, it is possible to improve controllability of a temperature of a substrate mounted on a substrate support in a state in which plasma is generated.

It should be considered that the plasma processing method and the plasma processing apparatus according to the present embodiment disclosed herein are exemplary and are not restrictive in all respects. The above-described embodiments may be modified and improved in various forms without departing from the scope of the appended claims and the gist thereof. The matters described in the plurality of embodiments may have other configurations within a consistent range, and may be combined within a consistent range.

According to the present disclosure in some embodiments, it is possible to provide a technique capable of improving controllability of a temperature of a substrate held by a substrate support.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing method performed by a plasma processing apparatus, wherein the plasma processing apparatus includes:

a base;

a substrate support disposed on the base and having a substrate support surface for supporting a substrate;

a first heater disposed inside the substrate support and configured to adjust a temperature of the substrate support surface;

a first temperature sensor configured to measure the temperature of the substrate support surface; and a first electric power adjuster configured to adjust electric power supplied to the first heater, and wherein the plasma processing method comprises:

setting the temperature of the substrate support surface to a first temperature;

supplying electric power from the first electric power adjuster to the first heater;

before plasma is generated, when the temperature of the substrate support surface measured by the first temperature sensor stabilizes at the first temperature, measuring first electric power supplied to the first heater by the first electric power adjuster;

after the plasma is generated, when the temperature of the substrate support surface measured by the first temperature sensor stabilizes at the first temperature, measuring second electric power supplied to the first heater by the first electric power adjuster;

calculating a first input heat quantity input from the plasma based on the first electric power and the second electric power; and correcting the first temperature to a second temperature based on the first input heat quantity and a thermal resistance between the substrate support and the first temperature sensor or between the substrate and the first temperature sensor.

2. The plasma processing method of claim 1, wherein the substrate support includes a main body made of a dielectric material and an electrode in the main body.

3. The plasma processing method of claim 2, wherein the first temperature sensor is disposed closer to the base than the first heater.

4. The plasma processing method of claim 3, wherein the substrate support has a plurality of regions, and wherein the first heater is disposed for each of the plurality of regions.

5. The plasma processing method of claim 4, wherein the first temperature sensor is disposed for each of the plurality of regions.

6. The plasma processing method of claim 5, wherein the first electric power adjuster is configured to adjust the electric power supplied to the first heater and control the temperature of the substrate support surface measured by the first temperature sensor to a set temperature.

7. The plasma processing method of claim 6, wherein the plasma processing apparatus further includes:

a ring support disposed on the base and having a ring support surface for supporting an annular member;

a second heater configured to adjust a temperature of the annular member;

a second temperature sensor configured to measure a temperature of the ring support surface; and a second electric power adjuster configured to adjust electric power supplied to the second heater, and wherein the plasma processing method further comprises:

setting the temperature of the ring support surface to a third temperature;

supplying electric power from the second electric power adjuster to the second heater;

before the plasma is generated, when the temperature of the ring support surface measured by the second temperature sensor stabilizes at the third temperature, measuring third electric power supplied to the second heater by the second electric power adjuster;

after the plasma is generated, when the temperature of the ring support surface measured by the second temperature sensor stabilizes at the third temperature, measuring fourth electric power supplied to the second heater by the second electric power adjuster;

calculating a second input heat quantity input from the plasma based on the third electric power and the fourth electric power; and correcting the third temperature to a fourth temperature based on the second input heat quantity and a thermal resistance between the ring support and the second temperature sensor or between the annular member and the second temperature sensor.

8. The plasma processing method of claim 7, wherein the ring support is provided separately from the substrate support.

9. The plasma processing method of claim 7, wherein the second temperature sensor is disposed closer to the base than the second heater.

10. The plasma processing method of claim 7, wherein the ring support has a plurality of regions, and wherein the second heater is disposed for each of the plurality of regions.

11. The plasma processing method of claim 1, wherein the first temperature sensor is disposed closer to the base than the first heater.

12. The plasma processing method of claim 1, wherein the substrate support has a plurality of regions, and wherein the first heater is disposed for each of the plurality of regions.

13. The plasma processing method of claim 1, wherein the first electric power adjuster is configured to adjust the electric power supplied to the first heater and control the temperature of the substrate support surface measured by the first temperature sensor to a set temperature.

14. The plasma processing method of claim 1, wherein the plasma processing apparatus further includes:

a ring support disposed on the base and having a ring support surface for supporting an annular member;

a second heater configured to adjust a temperature of the annular member;

a second temperature sensor configured to measure a temperature of the ring support surface; and a second electric power adjuster configured to adjust electric power supplied to the second heater, and wherein the plasma processing method further comprises:

setting the temperature of the ring support surface to a third temperature;

supplying electric power from the second electric power adjuster to the second heater;

before the plasma is generated, when the temperature of the ring support surface measured by the second temperature sensor stabilizes at the third temperature, measuring third electric power supplied to the second heater by the second electric power adjuster;

after the plasma is generated, when the temperature of the ring support surface measured by the second temperature sensor stabilizes at the third temperature, measuring fourth electric power supplied to the second heater by the second electric power adjuster;

calculating a second input heat quantity input from the plasma based on the third electric power and the fourth electric power; and correcting the third temperature to a fourth temperature based on the second input heat quantity and a thermal resistance between the ring support and the second temperature sensor or between the annular member and the second temperature sensor.

15. A plasma processing method performed by a plasma processing apparatus, wherein the plasma processing apparatus includes:

a base;

a ring support disposed on the base and having a ring support surface for supporting an annular member;

a second heater configured to adjust a temperature of the annular member;

a second temperature sensor configured to measure a temperature of the ring support surface; and a second electric power adjuster configured to adjust electric power supplied to the second heater, and wherein the plasma processing method comprises:

setting the temperature of the ring support surface to a third temperature;

supplying electric power from the second electric power adjuster to the second heater;

before plasma is generated, when the temperature of the ring support surface measured by the second temperature sensor stabilizes at the third temperature, measuring third electric power supplied to the second heater by the second electric power adjuster;

after the plasma is generated, when the temperature of the ring support surface measured by the second temperature sensor stabilizes at the third temperature, measuring fourth electric power supplied to the second heater by the second electric power adjuster;

calculating an input heat quantity input from the plasma based on the third electric power and the fourth electric power; and correcting the third temperature to a fourth temperature based on the calculated input heat quantity and a thermal resistance between the ring support and the second temperature sensor or between the annular member and the second temperature sensor.

16. The plasma processing method of claim 15, wherein the second temperature sensor is disposed closer to the base than the second heater.

17. The plasma processing method of claim 15, wherein the ring support has a plurality of regions, and wherein the second heater is disposed for each of the plurality of regions.

18. The plasma processing method of claim 17, wherein the second temperature sensor is disposed for each of the plurality of regions.

19. A plasma processing apparatus, comprising:

a base;

a substrate support disposed on the base and having a substrate support surface for supporting a substrate;

a heater disposed inside the substrate support and configured to adjust a temperature of the substrate support surface;

a temperature sensor configured to measure the temperature of the substrate support surface;

an electric power adjuster configured to adjust electric power supplied to the heater;

a plasma generator configured to generate plasma; and a controller, wherein the controller is configured to execute:

setting the temperature of the substrate support surface to a first temperature;

supplying electric power from the electric power adjuster to the heater;

before the plasma is generated, when the temperature of the substrate support surface measured by the temperature sensor stabilizes at the first temperature, measuring first electric power supplied to the heater by the electric power adjuster;

after the plasma is generated, when the temperature of the substrate support surface measured by the temperature sensor stabilizes at the first temperature, measuring second electric power supplied to the heater by the electric power adjuster;

calculating an input heat quantity input from the plasma based on the first electric power and the second electric power; and correcting the first temperature to a second temperature based on the calculated input heat quantity and a thermal resistance between the substrate support and the temperature sensor or between the substrate and the temperature sensor.

20. The plasma processing apparatus of claim 19, wherein the temperature sensor is disposed closer to the base than the heater.

\* \* \* \* \*